United States Patent

Shinmura

[11] Patent Number: 6,030,511
[45] Date of Patent: *Feb. 29, 2000

[54] COLLIMATED SPUTTERING METHOD AND SYSTEM USED THEREFOR

[75] Inventor: Toshiki Shinmura, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/595,823

[22] Filed: Feb. 2, 1996

[30] Foreign Application Priority Data

| Feb. 3, 1995 | [JP] | Japan | 7-016618 |
| Feb. 21, 1995 | [JP] | Japan | 7-032225 |

[51] Int. Cl.⁷ .................................................. C23C 14/34
[52] U.S. Cl. ............................... 204/192.15; 204/192.12; 204/192.13; 204/192.16; 204/298.13
[58] Field of Search .................. 204/192.12, 192.13, 204/192.15, 192.16, 298.03, 298.08, 298.13, 298.2

[56] References Cited

U.S. PATENT DOCUMENTS

| 4,508,612 | 4/1985 | Blackwell et al. | 204/298.11 |
| 4,927,513 | 5/1990 | Schuliss et al. | 204/298.11 X |
| 5,087,297 | 2/1992 | Pouliquen | 204/298.13 X |
| 5,171,412 | 12/1992 | Talieh et al. | 204/298.11 X |
| 5,330,628 | 7/1994 | Demaray et al. | 204/298.11 X |
| 5,409,587 | 4/1995 | Sandhu et al. | 204/298.11 X |
| 5,807,467 | 9/1998 | Givens et al. | 204/192.12 |

FOREIGN PATENT DOCUMENTS

| 59-104476 | 6/1984 | Japan | C23C 15/00 |
| 145771 | 6/1988 | Japan | 204/298.13 |
| 1-116070 | 5/1989 | Japan | C23C 14/34 |
| 5-29257 | 2/1993 | Japan | H01L 21/285 |
| 406-93436 | 4/1994 | Japan | 204/298.13 |
| 61-36527 | 5/1994 | Japan | C23C 14/34 |
| 6-603908 | 8/1994 | Japan | C23C 14/34 |
| 6-60391 | 8/1994 | Japan | C23C 14/34 |

OTHER PUBLICATIONS

Maissed et al., Handbook Thin Film Technology, McGraw–Hill Book Co., 1970, pp. 3–25 to 3–37 and 4–17 to 4–18.

"Collimated Sputtering of TiN/Ti Liners inot Sub–Half Micron High Aspect Ration Contacts/Lines" Joshi et al; Jun. 9–10, 1992; umic Conference, pp. 253–259.

"Contribution of Anisotropic Velocity Distribution of Recoil Atoms To Sputtering Yeilds and Angular Distributions of Sputtered Atoms"; Yamamura; Raciation Effects, 1981; vol. 55; pp. 49–56.

*Primary Examiner*—Nam Nguyen
*Assistant Examiner*—Steven H. Ver Steeg
*Attorney, Agent, or Firm*—Hayes Soloway Hennessey Grossman & Hage, PC

[57] ABSTRACT

A collimated sputtering method that enables to improve the deposition rate per applied unit power and the bottom coverage is provided. This method contains a step of controlling a condition of a glow discharge in a chamber to increase a rate of a sputtered species that is contained in a specified angle range and that passes through a collimator. The rate of the sputtered species that can pas through the collimator is increased. Also, the rate of the passed species travelling parallel to the normal direction is increased. The sputtering surface of the target contains a crystal plane that is approximately perpendicular to a crystal axis having a shortest interatomic distance.

5 Claims, 7 Drawing Sheets

COLLIMATED SPUTTERING METHOD AND SYSTEM USED THEREFOR

BACKGROUND OF THE INVENTION

1. Field of the Invention

The present invention relates to a collimated sputtering method and a system used therefor and more particularly, to a collimated sputtering method applicable to formation or deposition of various thin films for semiconductor device fabrication process, and a collimated sputtering system used for the method.

2. Description of the Prior Art

Recently, the integration level of semiconductor integrated circuit devices has been increasing, as has the use of three-dimensional device structures. As a result, contact holes, which are used for electrically connecting an interconnection film or films with underlying conductor regions through an insulator film or films, have had a higher aspect ratio. The aspect ratio is defined as a ratio of a depth of the hole to a diameter thereof.

A titanium (Ti) film, when directly contact with a silicon substrate or layer, produces a titanium silicide ($TiSi_2$) film during a heat-treatment process to thereby reduce and stabilize its contact resistance. Accordingly, the Ti film has been popularly employed for the interconnection film.

However, as shown in FIG. 1, a Ti film produced by a conventional non-collimated sputtering method has a very low bottom coverage. This bottom coverage decreases to 10% or less with the increasing aspect ratio of the contact holes.

For example, as shown in FIG. 2, an insulator film 32 such as a silicon dioxide ($SiO_2$) film having a penetrating contact hole 32a is formed on a single-crystal silicon substrate 31. The hole 32a has a diameter of d and a depth of h and therefore, an aspect ratio of the hole 32a is expressed as (h/d). Since h is much greater than d, the aspect ratio is very high.

A titanium (Ti) film 33 is formed on the insulator film 32 to cover the contact hole 32a. A titanium nitride (TiN)film 34 is formed on the Ti film 33, and a tungsten (W) film 35 is formed on the TiN film 34. The Ti, TiN and W films 33, 34 and 35 constitute an interconnection conductor to be electrically connected to the substrate 31 through the contact hole 32a.

If the Ti film 33 has a large thickness (for example, 10 nm) to ensure a sufficient thickness of the Ti film 33 at the bottom of the contact hole 32a, the top opening of the hole 32a becomes narrow due to the deposited Ti film 33 on the sidewall of the hole 32a. This hinders the subsequently deposited TiN and W films 34 and 35 from burying the hole 32a.

Also, even if the thickness of the Ti film 33 is increased until the top opening of the contact hole 32a is closed by the Ti film 33, the thickness of the Ti film 33 at the bottom of the hole 32a does not become sufficiently large. This means that no good contact characteristic is obtained.

To solve the above problem relating to the bottom coverage in the contact hole 32a, a collimated sputtering method was developed, which was disclosed in the Japanese Examined Patent Publication No. 6-60391 published in August 1994 and the Japanese Non-Examined Patent Publication No. 1-116070 published in May 1989. In this method, a plate-like collimator having a large number of penetrating apertures is used. The sputtered species or atoms of a target travel through the apertures of the collimator to the substrate.

The collimator traps the sputtered species travelling in the direction tilted at large angles with respect to the normal direction to the sputtering surface of the target (i.e., the surface normal direction), thereby controlling or limiting the directionality of the sputtered species. Thus, the rate of the travelling sputtered species that can reach the bottom of the contact hole increases to thereby improve the bottom coverage, which is shown in FIG. 1.

FIG. 1 shows the aspect ratio dependency of the bottom coverage curve of the conventional collimated sputtering method in which the apertures of the collimator has an aspect ratio of 1.5. Similar to the case of the contact holes, the aspect ratio of the apertures of the collimator is defined as a ratio of a depth of the aperture to a diameter thereof. If this value of the aspect ratio is further raised, a higher bottom coverage is obtained, because the collimator allows the sputtered species travelling in the directions tilted at smaller angles to the surface normal direction to pass therethrough.

With the above conventional collimated sputtering method, the angular distribution of the sputtered species was not fully considered to make it suitable to the collimated sputtering. In other words, the angular distribution was not optimized for this purpose.

Specifically, with the above conventional collimated sputtering method disclosed in the Japanese Examined Patent Publication No. 6-60391, the discharging voltage, which is a voltage applied across the substrate and the target for generating a glow discharge, is 500 to 600 V. Therefore, the rate of the sputtered species travelling along the surface normal direction is comparatively low. This means that the rate of the trapped species by the collimator is high; in other words, the rate of the species reaching the substrate is low.

For example, when a collimator with apertures having an aspect ratio of 1 is used, the rate of the species reaching the substrate through the collimator decreases to approximately a fifth (1/5) as much as that when no collimator is used. In this case, it can be said that a film is deposited on the collimator rather than on the substrate.

FIG. 3 shows the angular distribution of the sputtered species as a function of the tilted angle with respect to the surface normal direction, in which the applied voltage for discharge is used as a parameter. As seen from FIG. 3, when the discharging voltage is as low as 500 V, the relative number of the species in a direction tilted at 45° with respect to the surface normal direction of the target and that in a direction tilted at an angle of zero (0) (i.e., parallel to the surface normal direction) are approximately 5:3.

The sputtered species that are trapped by the collimator narrow the paths of their apertures and therefore, the sputtering or deposition rate decreases with the increasing repetition number of use, which requires frequent exchange of the collimator. This means that the lifetime of the collimator is short. Such a problem becomes remarkable when the collimator apertures have a high aspect ratio in order to obtain a higher bottom coverage.

Further, with the above conventional collimated sputtering method, the same target as that used for the conventional non-collimated sputtering method has been used. The relationship between the sputtering surface of the target and the direction of its crystal axes was not considered.

For example, for a polycrystalline titanium target that has been used in the conventional collimated sputtering method, the approximately 80% grains of the target have a (0001) plane on the sputtering surface. Therefore, this target has an angular distribution of the sputtered species as shown in FIG. 4 in which the relative number of the species is relatively low in the surface normal direction and relatively high in the oblique direction thereto. The peak of the relative number is tilted at approximately 35 degrees with respect to the surface normal direction. The relative number at the peak angle and that in the normal direction is approximately 2:1.

As a result, the relative number of the sputtered species trapped by the collimator is large and therefore, the relative number of the species reaching the substrate is small. For a collimator with the aperture aspect ratio of 1, the relative number of the species reaching the substrate through the collimator decreases to approximately (⅕) as much as that when no collimator is used. In this case, it can be said that a film is deposited on the collimator rather than on the substrate. This leads to a low growth or deposition rate per applied unit power.

Additionally, with the above conventional collimated sputtering method, a satisfactorily high bottom coverage cannot be obtained corresponding to a high aperture aspect ratio of the collimator. This is caused by the angular distribution of the travelling, sputtered species.

Specifically, the collimator does not allow only the species travelling in a direction exactly parallel to the surface normal direction to pass. The collimator allows the species travelling in directions inclined to the surface normal direction within a specified angle (for example, 33.7 degrees or larger for the collimator aspect ratio of 1.5) to pass also. Accordingly, if the relative number of the species near the specified angle is high and that near the surface normal direction is low within the angle range enabling the species to reach the substrate, good bottom coverage cannot be obtained.

The Japanese Non-Examined Patent Publication No. 5-29257, which was published in February 1993, disclosed a concept of controlling the distribution of the travelling sputtered species with respect to the sputtering surface of a target, thereby improving the shape of a deposited film in a recess or hole.

The Japanese Non-Examined Patent Publication No. 59-104476, which was published in June 1984, disclosed a concept of controlling a discharge voltage in response to drop of the voltage to thereby stabilize the plasma and deposition rate during a sputtering process.

SUMMARY OF THE INVENTION

Accordingly, an object of the present invention is to provide a collimated sputtering method that enables to improve the deposition rate per applied unit power and the bottom coverage, and a collimated sputtering system used therefor.

Another object of the present invention is to provide a collimated sputtering method that enables to reduce the exchange frequency of a target and a collimator, and a collimated sputtering system used therefor.

These objects together with others not specifically mentioned will become clear to those skilled in the art from the following description.

A collimated sputtering method according to a first aspect of the present invention includes the step of controlling a condition of a glow discharge in a chamber to increase a rate of sputtered species that is contained in a specified angle range and that passes through a collimator.

With the collimated sputtering method according to the first aspect, the condition of the glow discharge is controlled to increase a rate of sputtered species that is contained in a specified angle range and that pass through a collimator. Therefore, the rate of the sputtered species that can pass through the collimator is increased. Also, the rate of the passed species travelling parallel to the surface normal direction is increased.

As a result, the target can be sputtered with a high efficiency and consequently, both of the deposition rate per applied unit power and the bottom coverage can be improved. The exchange frequency of the target and the collimator can be reduced.

In a preferred embodiment of the method according to the first aspect, the rate of the sputtered species is increased by increasing a flux of the travelling species along a normal to a sputtering surface of the target.

Preferably, the control of the condition is performed by selecting a value of a voltage applied between the substrate and the target. The value of the voltage is preferably in a range from 1000 V to 4000 V.

It is preferred that the collimator has apertures whose aspect ratio is less than unity, and the value of the voltage is in a range from 1500 V to 4000 V.

When a magnet for creating a magnetic field in the chamber is provided to realize a magnetron sputtering process, the value of the voltage is preferably selected by changing a distance between the magnet and the target. The change of the distance is preferably performed by relatively moving the magnet with respect to the target.

The pressure of a sputtering gas contained in the chamber is preferably at most 1 mTorr.

Another embodiment of the method according to the first aspect includes the following steps:

First, a target is prepared, a sputtering surface of which contains a crystal plane that is approximately perpendicular to a crystal axis having a shortest interatomic distance. Then, the target is placed in a chamber to increase a rate of the sputtered species that pass through a collimator in a direction along a normal to the sputtering surface of the target.

In this embodiment, since the target has the sputtering surface containing a crystal plane approximately perpendicular to a crystal axis having a shortest interatomic distance, the rate of the sputtered species travelling along the normal direction of the target increases.

As a result, the target can be sputtered with a high efficiency and consequently, both of the deposition rate per applied unit power and the bottom coverage can be improved. The exchange frequency of a target and a collimator can be reduced.

When the target is made of a crystalline material having a hexagonal close-packed structure, and an emitting or sputtering surface of the target is approximately parallel to a crystal plane of (1120). In this case, the target is preferably made of single-crystal titanium.

When the target is made of a crystalline material having a face-centered cubic structure, and an emitting surface of the target is approximately parallel to a crystal plane of (110). In this case, the target is preferably made of single-crystal aluminum.

Preferably, the chamber is filled with a sputtering gas whose pressure is in a range from 0.1 mTorr to 3 mTorr, and the glow discharge is created in the sputtering gas.

A collimated sputtering system according to a second aspect of the present invention includes a chamber; a substrate holder placed in the chamber; a target holder placed in the chamber; a collimator placed between the substrate holder and the target holder in the chamber; a vacuum pumping system for creating a specified vacuum in the chamber; and a controllable power supply for supplying a voltage to the substrate holder and the target holder to thereby produce a glow discharge therebetween.

Energetic species are generated in the chamber by the glow discharge to sputter the target, producing energetic species. The species travels toward the substrate through the collimator and are deposited on the substrate to form a film thereon. A means for controlling a condition of the glow discharge is provided to increase a rate of the sputtered species that is contained in a specified angle range and that passes through the collimator.

With the collimated sputtering system according to the second aspect, the condition of the glow discharge is controlled to increase a rate of a sputtered species that is contained in a specified angle range and that pass through a collimator. Therefore, the rate of the sputtered species that can pass through the collimator is increased. Also, the rate of the passed species travelling parallel to the normal direction is increased. As a result, the same advantages as those in the first embodiment are obtained.

In a preferred embodiment of the system according to the second aspect, this system further contains a magnet for creating a magnetic field in the chamber to realize a magnetron sputtering process. The value of the voltage is selected by changing a distance between the magnet and the target.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Figure 1:
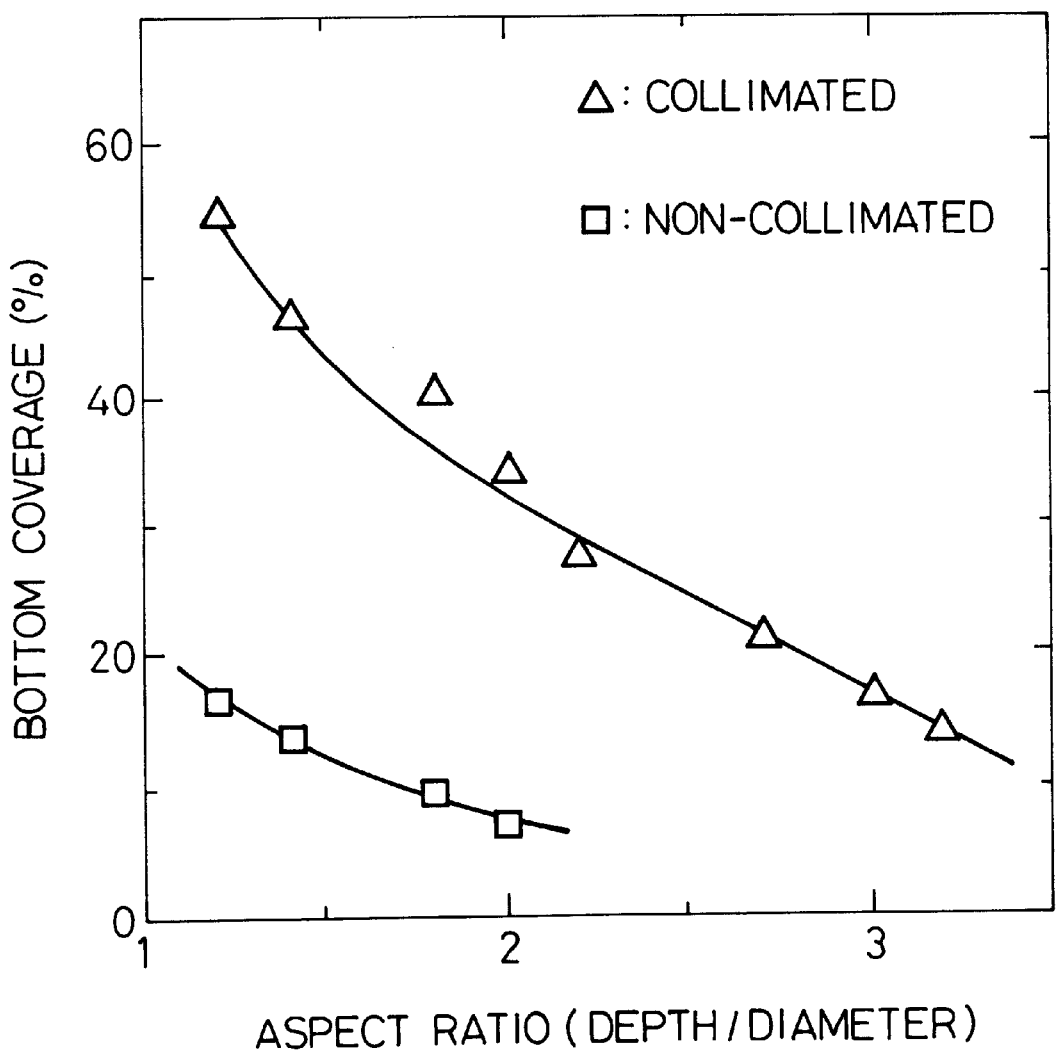
FIG. 1 is a graph showing the relationship between the aspect ratio of a contact hole and the bottom coverage obtained in the conventional non-collimated and collimated sputtering methods.
Figure 2:
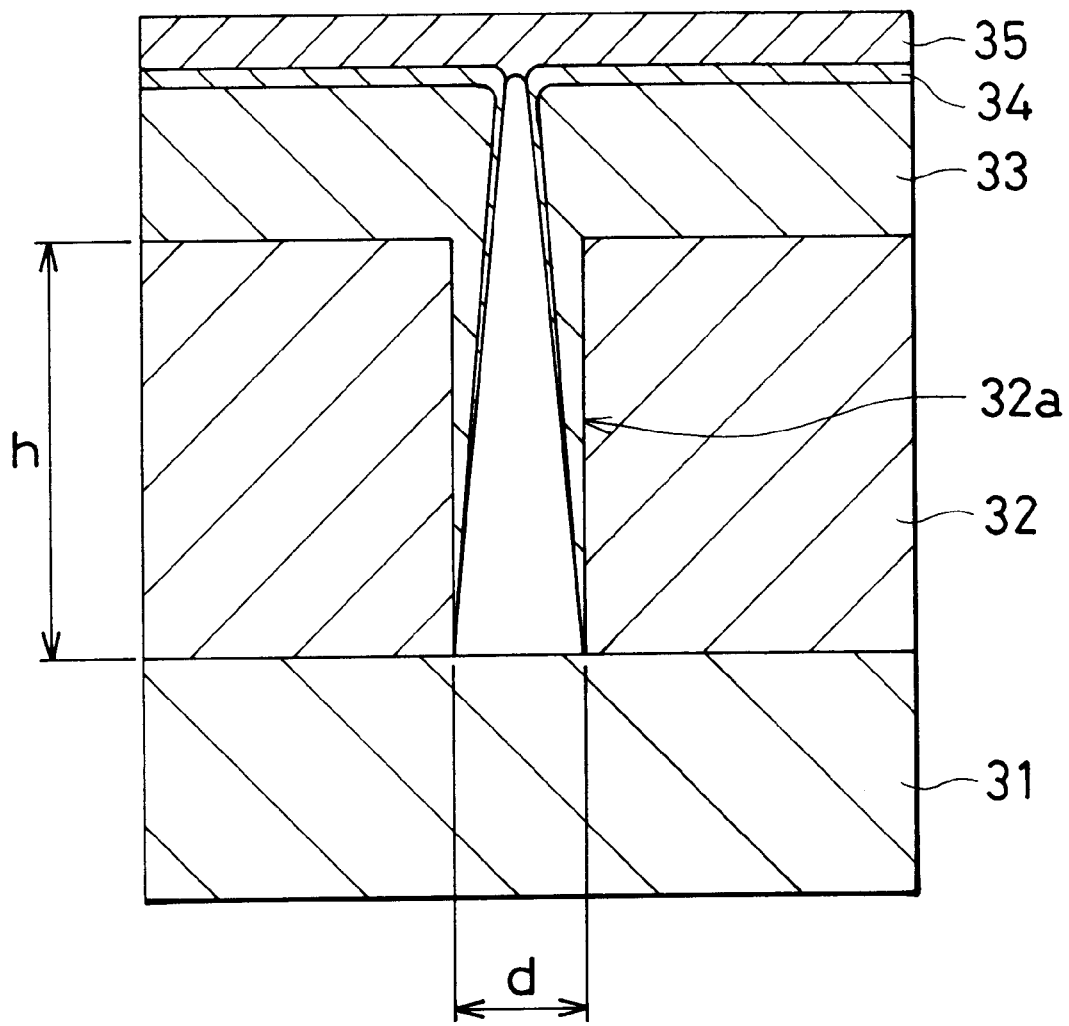
FIG. 2 is a partial, cross-sectional view of a semiconductor device, which schematically shows the state where the lower Ti film prevents the middle TiN film and the upper W film from burying the contact hole.

Preferred embodiments of the present invention will be described in detail below while referring to the drawings attached.

First Embodiment

Figure 5:
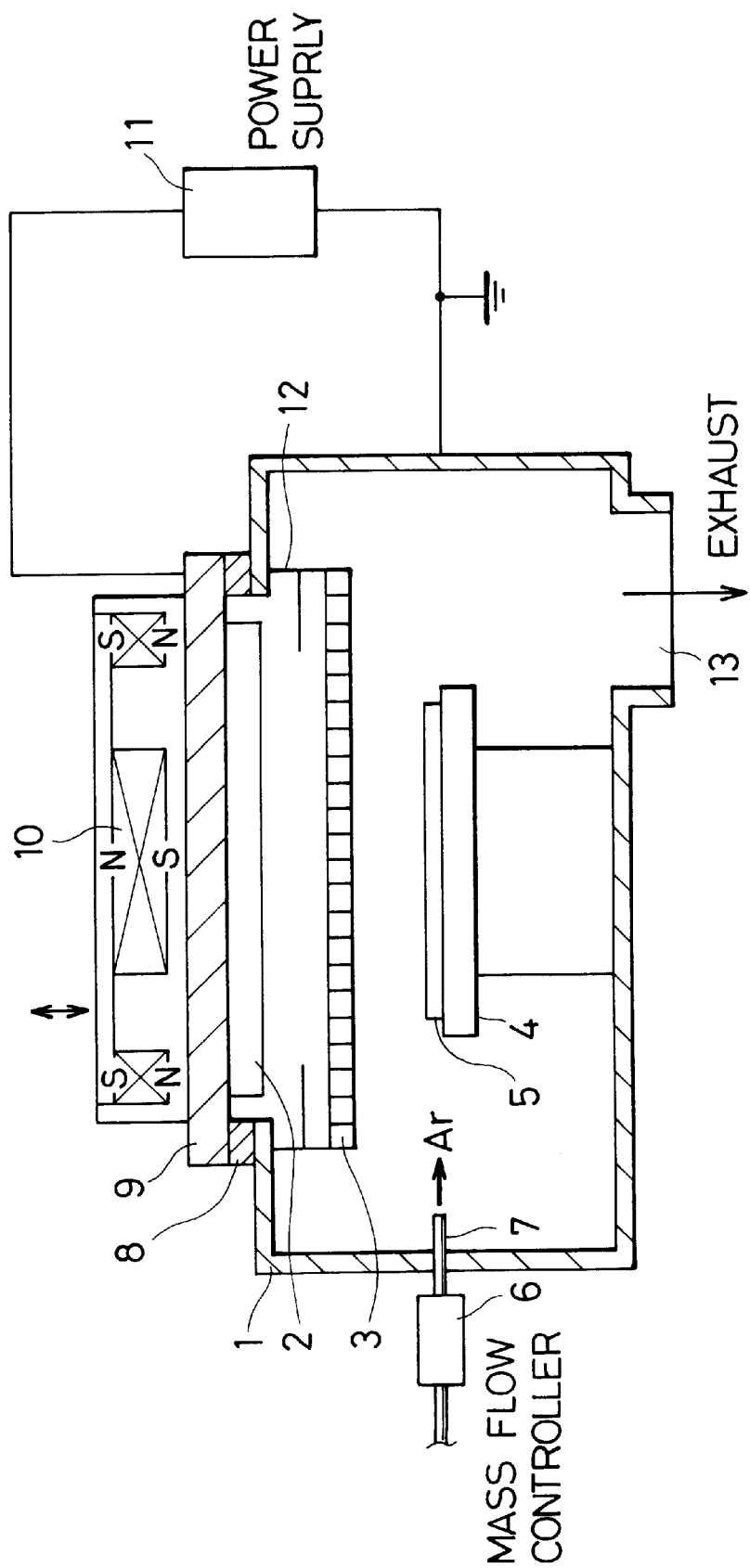
FIG. 5 is a schematically cross-sectional view of a collimated sputtering system according to an embodiment of the invention.

In a collimated sputtering method according to a first embodiment of the invention, the following process steps are performed using a collimated sputtering system as shown in FIG. 5.

In FIG. 5, the system contains a sputtering chamber 1 in which a sputtering process is performed. The chamber 1 has a backing plate 9 on its top, a gas inlet 7 on its sidewall, a substrate holder 4 on its bottom, and a gas outlet 13 on its bottom.

The substrate holder 4 is used for holding a semiconductor substrate 5. The backing plate 9 is used for holding a sputtering target 2. The plate 9 is fixed to the top of the chamber 1 through an insulator 8, thereby electrically insulating the plate 9 from the chamber 1.

A sputtering gas such as argon (Ar) is injected into the chamber 1 from a gas source (not shown) through the gas inlet 7 during a sputtering process. A mass flow controller 6 is provided outside the chamber 1 to control the flow rate of the sputtering gas. The sputtering gas is supplied to the chamber 1 through the inlet 7 at a specified flow rate.

The air and gas contained in the chamber 1 are exhausted away by a vacuum pumping system (not shown) through the gas outlet 13. The vacuum pumping system includes a cryopump to produce a high vacuum condition in the chamber 1.

A magnet 10 is placed on the backing plate 9. This magnet generates a magnetic field in the chamber 1, and is movable upward and downward.

A controllable power supply 11 is provided outside the chamber 1. The power supply 11 is electrically connected to the chamber 1 and the backing plate 9, and supplies direct current (dc) high voltages across the chamber 1 and the plate 9. The chamber 1 serves as an anode and the plate 9 as a cathode. The chamber 1 is grounded. The applied high voltage causes a plasma in the vicinity of the plate 9 in the chamber 1.

During a sputtering process, the sputtering target 2 (here, which is made of Ti) is held onto the lower face of the backing plate 9 in the chamber 1. The semiconductor substrate 5 (here, which is made of Si) is placed on the holder 4. The distance between the target 2 and the substrate 5 is set as approximately 100 mm.

Figure 9:
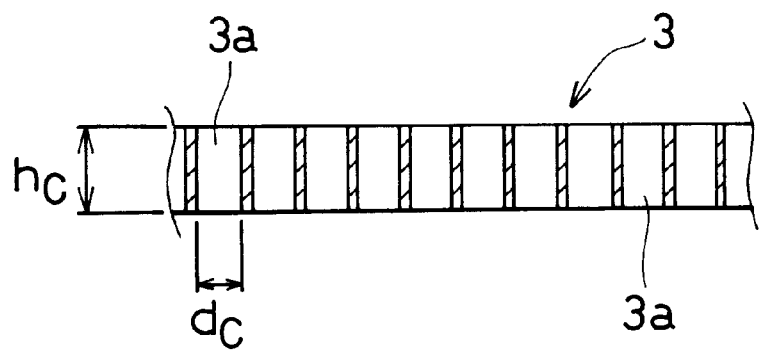
FIG. 9 is a schematically cross-sectional view of a collimator used for the collimated sputtering system shown in FIG. 5.

A collimator 3 with a circular plate-like shape is fixed between the target 2 and the substrate 5 in the chamber 1. As shown in FIG. 9, the collimator 3 has a large number of circular penetrating apertures 3a.

A cylindrical shield 12 is fixed onto the top wall of the chamber 1. The shield 12 is used for preventing the sputtered species or atoms from being deposited on the wall of the chamber 1.

Next, the collimated sputtering method according to the first embodiment is described below.

First, the target 2, collimator 3 and the substrate 5 is arranged as shown in FIG. 5. The air in the chamber 1 is pumped away by the vacuum pumping system so that its base pressure is kept in the order of $10^{-8}$ Torr in order to reduce the effect of oxygen ($O_2$).

An Ar gas is supplied to the chamber 1 from the gas source through the gas inlet 7. The flow rate of the Ar gas is controlled by the mass flow controller 6 to keep the Ar pressure at a specified value. The pressure value is suitably determined so that a wanted plasma is generated in the chamber and a wanted current flows.

For example, the Ar pressure is set as 0.3 mTorr. In this case, when a high voltage of several thousands volts is applied across the target 2 and the substrate 5 by the power supply 11, a current of approximately 10 A flows through the inside of the chamber 1. The applied voltage is, for example, set as 1500 V corresponding to the above pressure value.

The magnetic field produced by the magnet 10 is suitably controlled to realize a magnetron sputtering process in consideration with the applied electric field by the power supply 11. The magnetic field is set as 1000 Gauss at the chamber-side surface of the target 2.

The applied high voltage induces a glow discharge in the chamber 1 to thereby produce a plasma therein. The plasma exists in the vicinity of the target 2 and produces energetic ions. The energetic ions bombards the sputtering surface of the Ti target 2, thereby ejecting Ti atoms from the surface. The ejected Ti atoms are deposited on the substrate 5, growing a Ti film thereon.

Figure 3:
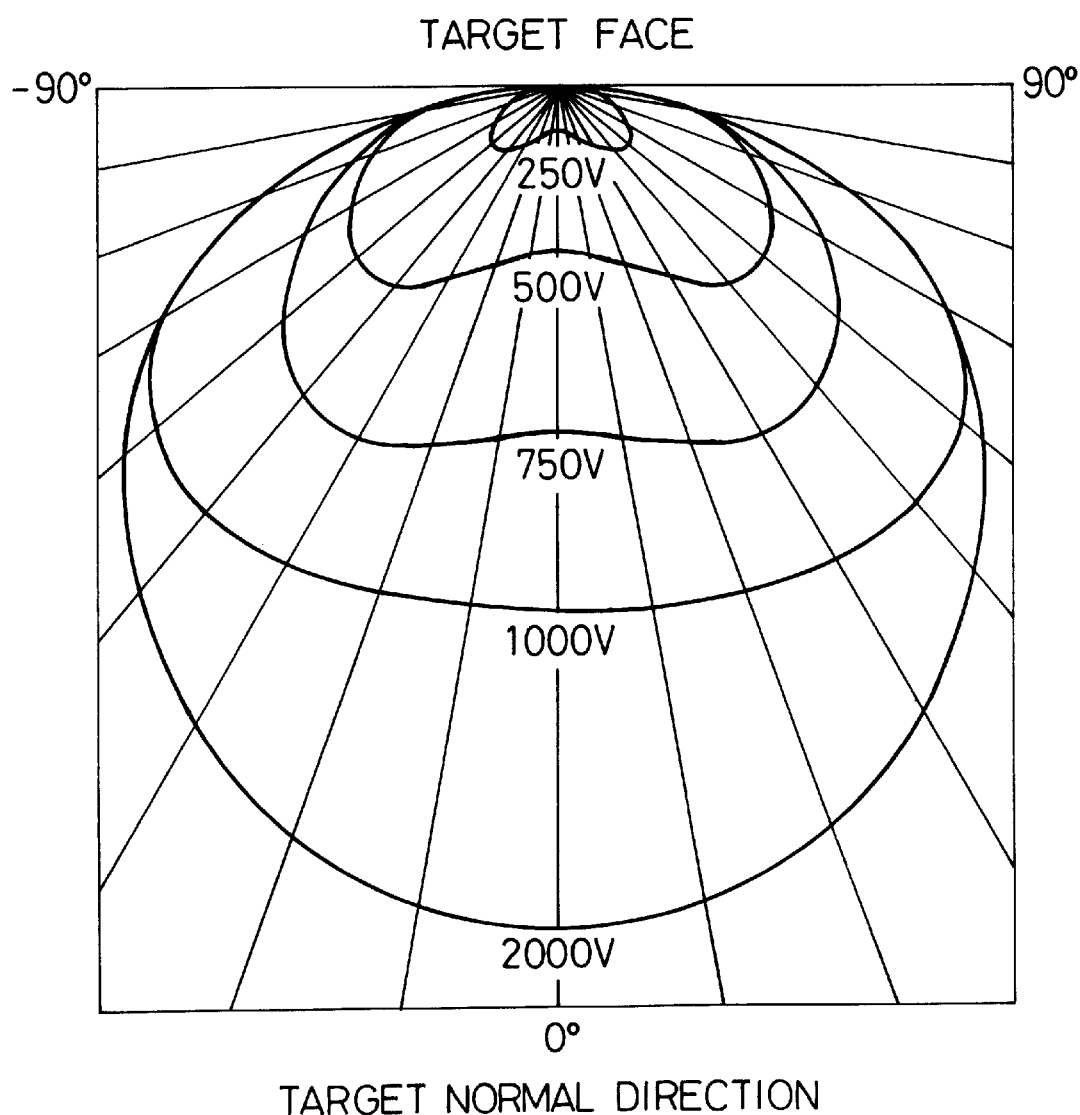
FIG. 3 is a graph showing the angular distributions of the travelling, sputtered species from the target.

In the method according to the first embodiment, the discharging voltage, i.e., the applied voltage by the power supply 11, is set as at lowest 600 V, and preferably as 1000 V or higher. The reason is as follows:

When the voltage is below 600 V, the rate of the sputtered Ti atoms ejected along the normal direction of the sputtering surface of the target 2 is very low, as shown in FIG. 3. As a result, the advantages of the invention cannot be obtained sufficiently.

As shown in FIG. 3, when the discharging voltage is 500 V, the relative number of the sputtered Ti atoms ejected along the surface normal direction (i.e., the oblique angle is zero) and that ejected along an oblique direction to the surface normal direction at 45 degrees are approximately 5:3. This means that the relative number of the ejected Ti atoms along the 45-degree oblique direction is greater than that along the surface normal direction. When the voltage is 1000 V, the relative numbers of the Ti atoms along the both directions are approximately 1:1.

On the other hand, the discharging voltage needs to be 4000 V or lower, the reason of which is as follows:

It is seen from FIG. 3 that the relative number of the Ti atoms ejected nearly parallel to the surface normal direction increases as the discharging voltage increases. However, if the voltage is excessively high, an abnormal glow discharge will be difficult to be generated, and electrical insulation of the system will be difficult to be ensured. The abnormal glow discharge, which is defined as a glow discharge in which the discharge area exists over the entire cathode, is essential for obtaining a stable deposited film.

In the case that an aspect ratio ($h_c/d_c$) of the aperture 3a of the collimator 3 is less than 1, the discharging voltage should be 1500 V or more, because the aspect ratio is very small. The collimator 3 with a small-aspect ratio restricts only a narrow angular range of the emitted Ti atoms and as a result, a higher voltage is necessary to increase sufficiently the rate of the ejected Ti atoms that can pass through the collimator 3.

The mean free path of the sputtered species is approximately 80 mm when the pressure of the sputtering gas or Ar is 1 mTorr. A typical distance between the target and the substrate is 50 mm to 100 mm. Therefore, the ejected Ti atoms are scarcely scattered by the Ar atoms during travelling from the target 2 to the substrate 5. Thus, as seen from FIG. 3, when the pressure of the Ar gas is 1 mTorr or less, if the discharging voltage is suitably determined so high that the rate of the Ti atoms ejected perpendicular to the emitting surface increases, the relative number or rate of the ejected Ti atoms trapped by the collimator 3 decreases. This means that the target 2 is used with a high efficiency and the collimator 3 is not so exchanged frequently.

In fact, a test was performed using the collimated sputtering system shown in FIG. 5, in which the collimator 3 had an aperture ratio ($h_c/d_c$) of 1. As a result, the rate of the Ti atoms passing through the collimator 3 increased by approximately 50%, as the discharging voltage increased from 500 V to 1500 V. Thus, the utilization efficiency of the collimator 3 was improved by 50% and the exchange frequency of the collimator 3 was reduced to (⅞).

The improvement of angle distribution of the ejected Ti atoms at a high-voltage sputtering leads to improvement of the bottom coverage of contact holes of semiconductor devices. Conventionally, in a collimated sputtering process, since the collimator 3 restricts the ejection angle distribution of the ejected atoms, it was thought that the ejection angle restriction by the collimator 3 gave no effect to the bottom coverage. However, the collimator 3 does not allow only the ejected species exactly parallel to the surface normal direction to pass therethrough, but it allows the ejected species whose eject direction are within a specified angle with respect to the surface normal direction. The specified angle varies dependent upon the aspect ratio of the collimator 3. If the collimator 3 has an aspect ratio of 1, the collimator 3 selectively traps the species whose eject direction are over 45 degrees. Accordingly, in this case, the change in the angle distribution of the species whose eject direction are within 45 degrees with respect to the surface normal direction causes the change in bottom coverage.

Figure 6:
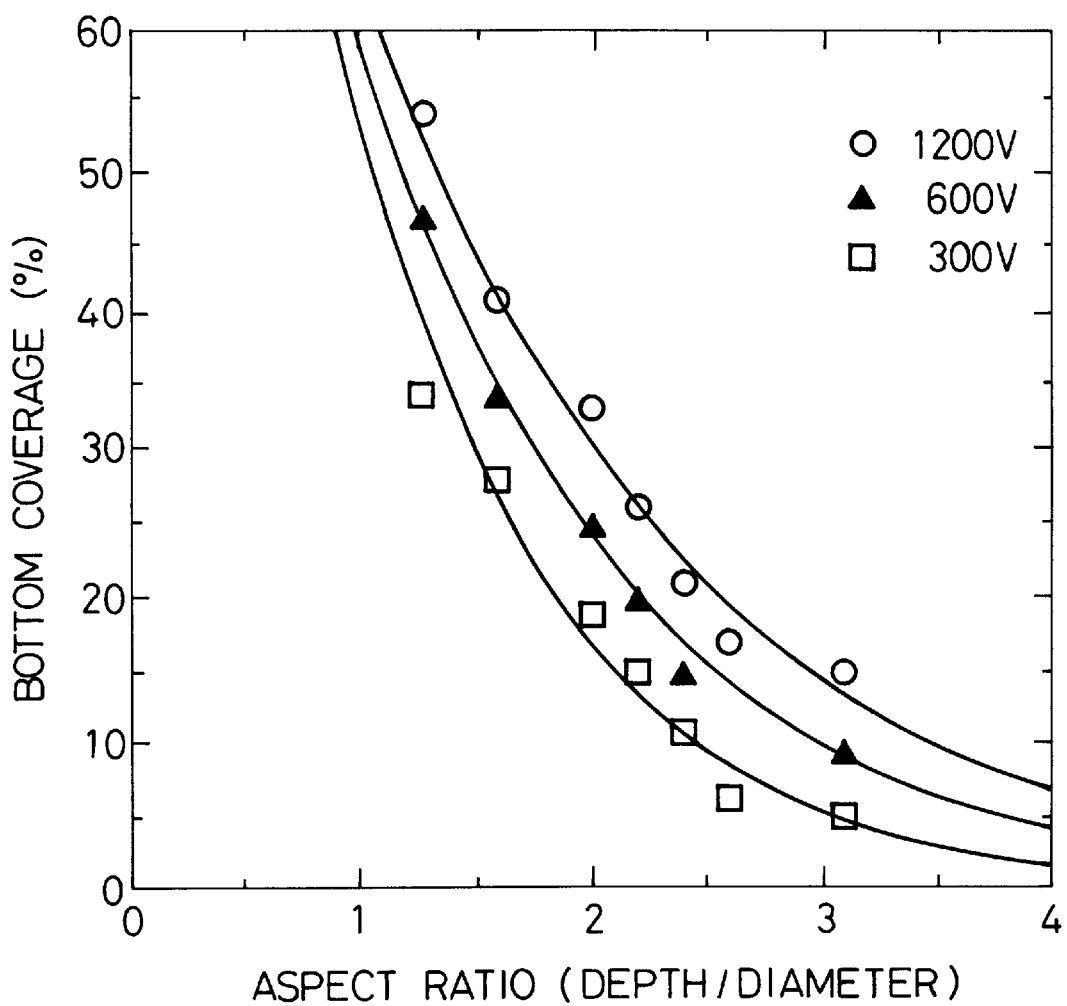
FIG. 6 is a graph showing the relationship between the aspect ratio of a contact hole and the bottom coverage obtained in a collimated sputtering method according to a first embodiment of the invention.

FIG. 6 shows the aspect ratio dependence of the bottom coverage where the discharging voltage is 300 V, 600 V and 1200 V, and the aspect ratio of the collimator 3 is 1. It is seen from FIG. 6 that improvement in the bottom coverage is relatively small within the area in which the aspect ratio is 2 or less, and that the case of 1200 V indicates a bottom coverage three times as high as that of 300 V within the area in which the aspect ratio is 3 or more where the collimator 3 is effective.

At a discharge voltage of 1000 V or higher, the sputtering or deposition rate does not increase in proportion to the voltage. Therefore, it is known that the deposition rate per unit power decreases in the conventional non-collimated sputtering method. However, in the collimated sputtering method, since the rate of the ejected Ti atoms that pass through the collimator 3 increases, the deposition rate per unit power also increases.

In fact, it was found that the deposition rate per unit power for 1500 V was higher than that for 500 V by approximately 20%.

In the first embodiment, a Ti target is employed. However, it is needless to say that any other metal can be employed at the target 2. For example, any non-alloy metal such as tungsten (W), copper (Cu) may be used, and any alloy such as Al-1.0%Si-0.5%Cu, Al-0.5%Cu may be used.

The angular distribution of the sputtered species varies according to the kind of metals or alloys and/or their crystal structures. However, in the method of the first embodiment, the energy of the incident Ar ions to the target 2 is enhanced by applying an increased discharging voltage, and as a result, the rate of the sputtered Ti atoms that are ejected along the directions near the surface normal direction can be increased.

This principle was disclosed theoretically by Y. Yamamura in Radiation Effects, 1981, Vol. 55, pp49–56. He showed the following equations (1) and (2). The general equation (1) is applicable to all cases, and the equation (2) is applicable to the directions near the normal of the target, the angles of which to the normal are small.

$$S(E, \theta) = 0.042 \times \alpha\left(\frac{M_1}{M_2}\right) \times \frac{1}{U_s} \times \cos\theta \times \left[1 - \frac{1}{2}\sqrt{\left(\frac{E_{th}}{E}\right)} \times \gamma(\theta)\right] \quad (1)$$

$$S(E, \theta) = 0.042 \times \alpha\left(\frac{M_1}{M_2}\right) \times \frac{1}{U_s} \times \cos\theta \times \left[1 - \sqrt{\left(\frac{E_{th}}{E}\right)}\left\{1 + \left(\frac{5}{3}\right)\cos^2\theta\right\}\right] \quad (2)$$

In the equations (1) and (2), $S(E,\theta)$ is a flux of the sputtered species in a direction oblique to the surface normal direction of the target at an angle $\theta$ when an incident energetic species having an energy E bombards the target along its normal direction. $\alpha(M_1/M_2)$ is an energy-independent function of the mass ratio between the target mass $M_2$ and the projectile mass $M_1$. $U_s$ is the surface binding energy, and $E_{TH}$ is the threshold energy. $\gamma(\theta)$ is an energy-independent function of $\theta$.

When the discharging voltage is several hundreds volts or over, the incident species can be approximated to be incident to the target along its normal direction. Therefore, the above equations (1) and (2) are applicable.

The energy E of the incident species increases proportionally with the increasing discharging voltage. Then, it is seen from the equations (1) and (2) that $\gamma(\theta)$ and $\cos^2\theta$ have large values for small values of $\theta$, and that the term $[(1/2)(E_{TH}/E)^{1/2}\cdot\gamma(\theta)]$ or $[(E_{TH}/E)^{1/2}\cdot\{1+(5/3)\cos^2\theta\}]$ has a small value at a high discharging voltage. As a result, it is seen that the angular distribution shape of the sputtered species becomes elongated along the normal of the target.

Second Embodiment

Next, a collimated sputtering method according to a second embodiment is described below.

In the method of the first embodiment, the Ar pressure in the chamber 1 is set as 0.3 mTorr, which is considerably lower than the case of an ordinary dc magnetron sputtering process in which the Ar pressure is set as several mTorr or several tens mTorr.

However, if a very low pressure such as 0.3 mTorr is difficult to be realized due to the structure and/or performance (for example, the flow rate of the Ar gas, the pumping rate, and so on), this method of the second embodiment is effective.

Specifically, the magnetic flux density in the vicinity of the chamber-side surface of the target 2 is reduced (for example, to 250 Gauss), which is realized by making the distance between the magnet 10 and the target 2 longer, by reducing the magnetic flux of the magnet 10 itself., or the like.

In the method of the second embodiment, such a low Ar pressure as in the first embodiment is not necessary. A voltage of several thousands volts applied by the power supply 11 produces a plasma in the chamber, which enables a discharge current of approximately 10 A. The other conditions not described here are the same as those of the first embodiment.

Third Embodiment

A collimated sputtering method according to a third embodiment is described below referring to FIGS. 7 and 8. This method contains the same process steps as those in the method according to the first embodiment and therefore, the description relating to the same steps is omitted here by adding the same reference numerals to the corresponding elements for simplification.

In the method of the third embodiment, the Ar pressure is set as 0.1 mTorr to 3 mTorr, and the discharging voltage is set as several hundreds volts (for example 500 V).

In this method, the sputtering surface of the Ti target 2 contains a crystal plane that is approximately perpendicular to a crystal axis having a shortest interatomic distance. This target 2 is placed in the chamber 2 to increase the rate of the sputtered Ti atoms that pass through the collimator 3 along the normal direction to the sputtering surface of the target 2.

Since the target 2 is made of a single-crystal Ti having a hexagonal close-packed structure, and a sputtering surface of the target 2 is approximately parallel to a crystal plane of (1120).

With the method according to the third embodiment, the rate of the sputtered Ti atoms travelling along the surface normal direction of the target 2 increases. As a result, the target 2 can be sputtered with a high efficiency and consequently, both of the deposition rate per applied unit power and the bottom coverage can be improved. The exchange frequency of a target and a collimator can be reduced.

Figure 4:
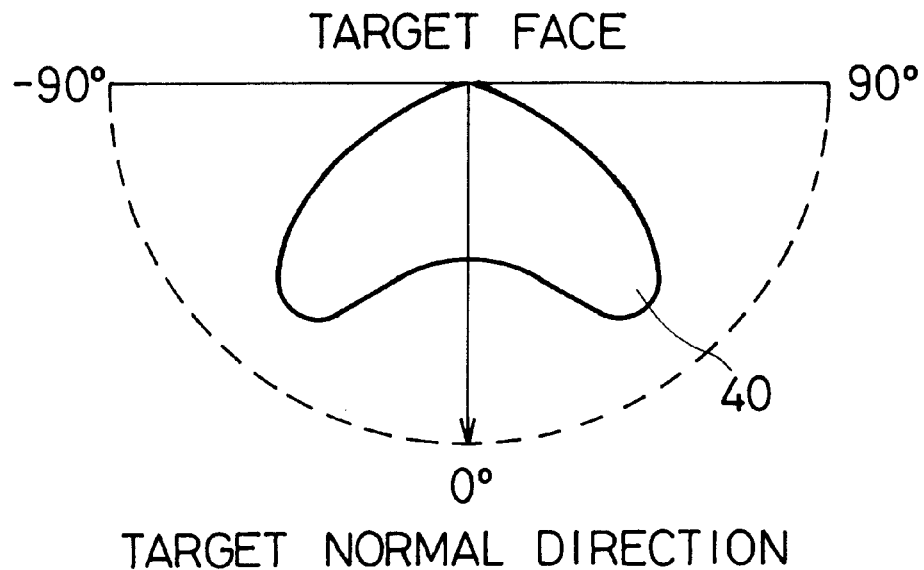
FIG. 4 is a graph showing the angular distributions of the travelling, sputtered species from the target obtained in the conventional method.
Figure 7:
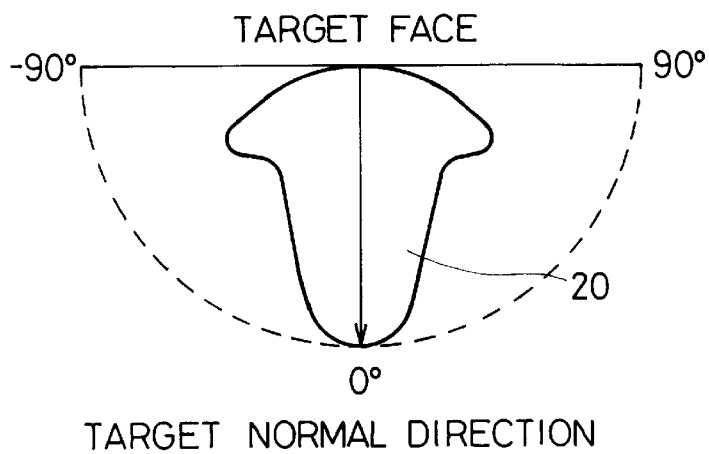
FIG. 7 is a graph showing the angular distributions of the travelling, sputtered species from the target obtained in a collimated sputtering method according to the first embodiment of the invention.
Figure 8:
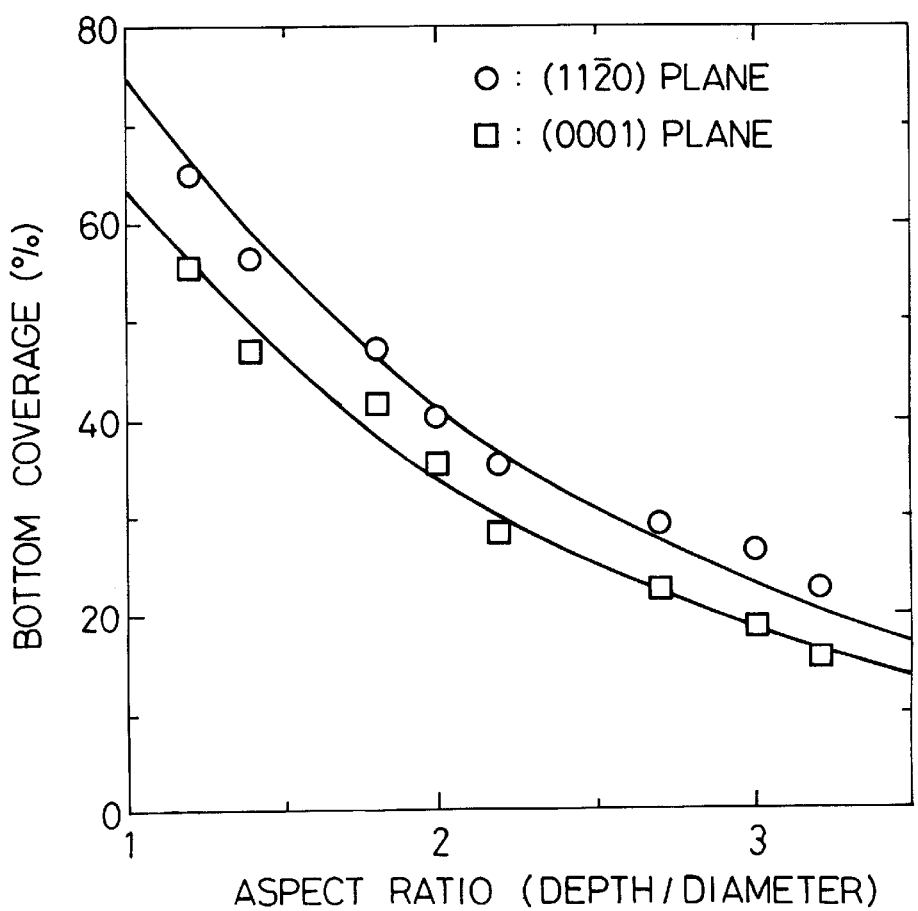
FIG. 8 is a graph showing the relationship between the aspect ratio of a contact hole and the bottom coverage obtained in a collimated sputtering method according to a second embodiment of the invention.

The angular distribution of the sputtered Ti atoms is shown in FIG. 7, in which the distribution has three peaks in the normal direction (0°) and two directions oblique to the normal direction at an angle of ±60°, respectively. The rate of the sputtered Ti atoms at the peak in the surface normal direction and those of at the peaks in the oblique directions are approximately 5:3. It is seen from FIGS. 4 and 7 that the rate of the Ti atoms ejected in the directions near the normal direction shown in FIG. 7 [(11–20)] is much larger than that shown in FIG. 4 [(0001)].

When the pressure of the sputtering gas or Ar is 3 mTorr, the mean free path of the sputtered Ti atoms is approximately several centimeters. Therefore, the ejected Ti atoms are scarcely scattered by the Ar atoms during travelling from the target 2 to the substrate 5. Thus, if the rate of the Ti atoms ejected in the directions near the normal direction is increased (see FIG. 7), the bottom coverage is improved as shown in FIG. 8. The reason of which is as follows:

As already stated above relating to the prior art, the collimator does not allow only the Ti atoms travelling in a direction exactly parallel to the normal direction to pass. The collimator 3 allows the Ti atoms travelling in a direction having a specified angle (in FIG. 8, 33.7 degrees or larger for the collimator aspect ratio of 1.5) to pass also. In the third embodiment, since the rate near the specified angle becomes lower and at the same time, the rate near the normal direction becomes higher within the angle range enabling the species to reach the substrate.

With the method of the third embodiment, since the Ti target 2 the crystal axis controlled is employed, the rate of the Ti atoms that are trapped by the collimator 3 decreases. Thus, under the condition that the Ar pressure is 3 mTorr, and the collimator 3 has an aspect ratio of 1.5, the deposition rate per unit power of the third embodiment increases up to 1.6 times compared with the conventional method where a (0001)-plane crystal is used. This means that the exchange frequency of the target 2 and the collimator 3 is reduced to (1/1.6).

When the pressure of the sputtering gas or Ar is 1 mTorr, the mean free path of the sputtered Ti atoms is approximately 80 mm or longer. Therefore, the ejected Ti atoms are scarcely scattered by the Ar atoms during travelling from the target 2 to the substrate 5. Thus, the advantage of the invention is enhanced.

When the Ar pressure is 1 mTorr, and the collimator 3 has an aspect ratio of 1.5, the deposition rate per unit power of the third embodiment increases up to 1.8 times compared with the conventional method where a (0001)-plane crystal is used. This means that the exchange frequency of the target 2 and the collimator 3 is reduced to (1/1.8).

The Ar pressure is limited to 3 mTorr or less, the reason of which is as follows:

The mean free path of the sputtered Ti atoms is several centimeters at the Ar pressure of 3 mTorr and therefore, almost all of the ejected Ti atoms are scattered by the Ar atoms prior to reaching the collimator 3. Thus, even if the rate of the sputtered Ti atoms ejected along the directions near the normal direction is enhanced, the enhanced rate decreases at a time of reaching the collimator 3 due to the scattering. As a result, the advantage of the invention is not fully obtained at the Ar pressure of over 3 mTorr.

The Ar pressure is limited to 0.1 mTorr or more, the reason of which is as follows:

In general, the mean free path of the sputtered Ti atoms becomes longer as the Ar pressure decreases and therefore, the Ar gas is preferably reduced to be as low as possible. However, within this pressure range, the threshold voltage for a glow discharge rises with the decreasing Ar pressure. As a result, an abnormal glow discharge necessary for stable deposition of films becomes difficult to be realized. To realize a stable glow discharge for the Ar pressure of 2 mTorr or less, raising the maximum magnetic field caused by the magnet 10 or enhancing the rated voltage of the power supply 11 is required. However, even if such the measures are taken, no stable glow discharge can be realized at the Ar pressure of below 0.1 mTorr.

The crystal-axis-controlled target 2 is, for example, readily produced in the following way:

A bulk single-crystal metal is first fabricated, which may have a diameter of approximately 5 cm. Next, the crystal planes of the bulk metal are measured by utilizing an X-ray diffraction. The crystalline bulk metal is then cut, thereby producing a plurality of slices of the metal. The slices have the same thickness and have a specified crystal planes. These slices are processed to be the same shape such as a square having four sides of several centimeters. The square slices are arranged onto the backing plate 9 not to create a gap between their slices; thus, a metal target with a desired size is obtained by combining the slices.

In the third embodiment, Ti is employed as a target 2 with the hexagonal close-packed structure. However, any other metal such as zirconium (Z), scandium (Sc) or the like may be used.

Fourth Embodiment

A collimated sputtering method according to a fourth embodiment is described below referring to FIGS. 7 and 8. This method contains the same process steps as those in the method according to the third embodiment and therefore, the description relating to the same steps is omitted here for simplification.

In the method of the fourth embodiment, the target 2 is made of an Al-0.5%Cu alloy having a face-centered cubic structure. The emitting surface of the target 2 is approximately parallel to a crystal plane of (110).

The crystal-axis-controlled target 2 is produced in the same way as that of the third embodiment.

The angular distribution of the sputtered aluminum alloy atoms is the same as shown in FIG. 7

With the method of the fourth embodiment, since the Al-Cu target 2 the crystals axis controlled is employed, the rate of the sputtered Al or Cu atoms that are trapped by the collimator 3 decreases. Thus, under the condition that the Ar pressure is 3 mTorr, and the collimator 3 has an aspect ratio of 1.5, the deposition rate per unit power of the fourth embodiment increases up to 1.9 times compared with the conventional method where no orientation is used. This means that the exchange frequency of the target 2 and the collimator 3 is reduced to (1/1.9).

In the fourth embodiment, Al-Cu alloy is employed as a target 2 with the face-centered cubic structure. However, any other metal such as gold (Au), silver (Ag), and copper (Cu) or the like may be used.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. In a collimated sputtering method using a collimator under a condition of glow discharge occurring in a chamber; said collimator having penetrating apertures whose aspect ratio is equal to unity or greater and being located between a target and a substrate in said chamber;

species, which are sputtered from said target due to said glow discharge and travel along a surface normal direction of said target and along approximate directions to said surface normal direction, being selectively reached to said substrate through said aperture of said collimator;

said method comprising the steps of:

controlling said condition of glow discharge to thereby increase a rate of said species traveling along longitudinal axis of said apertures of said collimator said target being a single-crystal whose crystal plane is approximately perpendicular to a crystal axis having a shortest interatomic distance;

and wherein said crystal plane is used as a sputtering surface, and said target has a hexagonal close-packed structure;

and wherein a crystal plane of ($11\bar{2}0$) of said target is used as said sputtering surface.

2. The method as claimed in claim 1, wherein said chamber is filled with a sputtering gas whose pressure is at most 1 mTorr;

and wherein said glow discharge is created in said sputtering gas.

3. The method as claimed in claim 1, wherein said target is made of single-crystal titanium.

4. The method as claimed in claim 1, wherein said target is made of single-crystal aluminum.

5. The method as claimed in claim 1, wherein said chamber is filled with a sputtering gas whose pressure is in a range from 0.1 mTorr to 3 mTorr;

and wherein said glow discharge is created in said sputtering gas.

* * * * *

UNITED STATES PATENT AND TRADEMARK OFFICE
CERTIFICATE OF CORRECTION

PATENT NO.    : 6,030,511
DATED         : February 29, 2000
INVENTOR(S)   : Toshiki Shinmura It is certified that error appears in the above-identified patent and that said Letters Patent is hereby corrected as shown below:

Column 12,
Line 41, insert "target" after -- crystal --
Line 48, remove "-" over -- 2 --

Signed and Sealed this

Seventh Day of May, 2002

Attest:

Attesting Officer

JAMES E. ROGAN
Director of the United States Patent and Trademark Office